United States Patent
Ludvigsen et al.

(10) Patent No.: US 9,934,481 B2
(45) Date of Patent: Apr. 3, 2018

(54) PLANNING DRILLING OPERATIONS USING MODELS AND RIG MARKET DATABASES

(71) Applicant: Schlumberger Technology Corporation, Sugar Land, TX (US)

(72) Inventors: Hallgrim Ludvigsen, Stavanger (NO); Ameziane Seddiki, Stavanger (NO)

(73) Assignee: Schlumberger Technology Corporation, Sugar Land, TX (US)

( * ) Notice: Subject to any disclaimer, the term of this patent is extended or adjusted under 35 U.S.C. 154(b) by 465 days.

(21) Appl. No.: 14/644,368

(22) Filed: Mar. 11, 2015

(65) Prior Publication Data
US 2015/0260015 A1    Sep. 17, 2015

Related U.S. Application Data

(60) Provisional application No. 61/952,464, filed on Mar. 13, 2014.

(51) Int. Cl.
| | |
|---|---|
| *G06G 7/48* | (2006.01) |
| *G06Q 10/06* | (2012.01) |
| *E21B 43/01* | (2006.01) |
| *G06F 17/50* | (2006.01) |

(52) U.S. Cl.
CPC ..... *G06Q 10/067* (2013.01); *G06Q 10/06313* (2013.01); *E21B 2043/0115* (2013.01); *G06F 17/50* (2013.01)

(58) Field of Classification Search
None
See application file for complete search history.

(56) References Cited

U.S. PATENT DOCUMENTS

| | | |
|---|---|---|
| 4,794,534 A | 12/1988 | Millheim |
| 6,738,748 B2 | 5/2004 | Wetzer |
| 7,216,086 B1 | 5/2007 | Grosvenor et al. |
| 7,512,544 B2 | 3/2009 | Carter et al. |
| 7,580,854 B2 | 8/2009 | Carter et al. |
| 7,650,294 B1 | 1/2010 | Carter et al. |
| 2003/0074391 A1* | 4/2003 | Carter .................. G06Q 10/04 709/200 |

(Continued)

OTHER PUBLICATIONS

International Search Report and Written Opinion issued in related PCT application PCT/US2015/020069 dated Jun. 11, 2015, 11 pages.

*Primary Examiner* — Cedric Johnson
(74) *Attorney, Agent, or Firm* — Alec J. McGinn

(57) ABSTRACT

Systems, methods, and media for planning drilling operations using modeling and simulation systems, and information obtained from drilling rig markets. Method, systems, and computer program products perform operations including querying a database of a drilling rig market using non-technical parameters of a drilling operation. The operations also include determining technical capabilities of one or more drilling rigs identified in a response to the querying of the database. The operations further include determining well paths for the drilling operation based on the technical capabilities of the drilling rigs. Additionally, the operations include selecting a drilling rig from the one or more drilling rigs for acquisition from the drilling rig market based on the plurality of well paths and the technical capabilities of the one or more drilling rigs.

16 Claims, 4 Drawing Sheets

(56) References Cited

U.S. PATENT DOCUMENTS

| | | | |
|---|---|---|---|
| 2004/0220846 A1* | 11/2004 | Cullick | G06Q 10/06 705/7.22 |
| 2007/0199721 A1* | 8/2007 | Givens | G06Q 10/06 166/382 |
| 2010/0088196 A1 | 4/2010 | Segura et al. | |
| 2011/0161133 A1 | 6/2011 | Staveley et al. | |
| 2013/0186687 A1 | 7/2013 | Snyder | |

* cited by examiner

PLANNING DRILLING OPERATIONS USING MODELS AND RIG MARKET DATABASES

CROSS-REFERENCE TO RELATED APPLICATIONS

This application claims priority to U.S. Provisional Patent Application No. 61/952,464, which was filed on Mar. 13, 2014 and is incorporated herein by reference in its entirety.

BACKGROUND

In drilling operations, operators (e.g., an oil or gas company) may contract or lease rig equipment included in a database of rigs available from a market (e.g., IHS Petrodata RigBase[SM]). The operators can lease the rigs for limited periods of time (e.g., a number weeks, months, and/or years). Accordingly, different rigs having different capabilities may become available at different times. An operator may lease a one of the rigs from the market that is able to perform the operator's tasks and schedule for a particular drilling operation.

SUMMARY

The present disclosure is directed to drilling operations and, more specifically to planning drilling operations using modeling and simulation systems, and information obtained from drilling rig markets.

Methods, systems, and computer program products in accordance with the present disclosure perform operations include querying a database of a drilling rig market using non-technical parameters of a drilling operation. The operations also include determining technical capabilities of one or more drilling rigs identified in a response to the querying of the database. The operations further include determining well paths for the drilling operation based on the technical capabilities of the drilling rigs. Additionally, the operations include selecting a drilling rig from the one or more drilling rigs for acquisition from the drilling rig market based on the plurality of well paths and the technical capabilities of the one or more drilling rigs Additionally, method, systems, and computer program products in accordance with the present disclosure perform operations include determining a well path of a drilling operation based on target information of an environment. The operations also include simulating drilling of the well path using a model of the environment. The operations further include determining a plurality of technical parameters required for a drill rig to complete the well path based on the simulating. Additionally, the operations include obtaining one or more non-technical parameters of the drilling operation. Moreover, the operations include selecting a drilling rig from a database of a drilling rig market based on the plurality of technical parameters and the one or more non-technical parameters.

In an embodiment, the one or more non-technical parameters comprise an availability requirement that defines time periods in which the drilling operation will begin and end.

In an embodiment, the operations further include obtaining target information for the drilling operation, the target information including a location of a reservoir in an environment and information describing one or more features of the environment.

In an embodiment, determining the plurality of well paths includes simulating drilling the plurality of well paths using a model of the environment and the technical capabilities of the one or more drilling rigs.

In an embodiment, simulating includes determining drilling energy requirements corresponding to the plurality of well paths.

In an embodiment, the operations further include acquiring the selected drilling rig from the drilling rig market, and performing the drilling operation of a well path of the plurality of well paths simulated using the selected drilling rig.

In an embodiment, the operations include obtaining the target information, the target information including a location of a reservoir in the environment and information describing the features of the environment.

In an embodiment, the one or more non-technical parameters include an availability requirement that defines time periods in which a drilling operation will begin and end.

In an embodiment, determining a plurality of technical parameters includes determining drilling energy requirements corresponding to drilling the well path.

In an embodiment, the plurality of technical parameters include a plurality of the following: maximum torque, maximum drag, maximum hydraulic pump capacity, maximum hook load, maximum rotational power, maximum water depth, maximum pump pressure, and maximum drilling depth.

In an embodiment, the selecting includes querying the database of the drilling market, and analyzing a result of the querying by comparing the technical parameters with technical capabilities of drilling rigs included in the drilling rig database.

In an embodiment, analyzing includes comparing the non-technical parameters with non-technical constraints of the drilling rigs included in the drilling rig database.

In an embodiment, the operations further include acquiring the selected drilling rig from the drilling rig market, and performing the drilling operation of the well path using the selected drilling rig.

It will be appreciated that this summary is intended merely to introduce some aspects of the present methods, systems, and media, which are more fully described and/or claimed below. Accordingly, this summary is not intended to be limiting.

BRIEF DESCRIPTION OF THE DRAWINGS

The accompanying drawings, which are incorporated in and constitute a part of this specification, illustrate embodiments of the present teachings and together with the description, serve to explain the principles of the present teachings.

DETAILED DESCRIPTION

The present disclosure is directed to drilling operations and, more specifically to planning drilling operations using modeling and simulation systems, and information obtained from drilling rig markets. Systems and methods in accordance with principles disclosed herein enable collaboration between various types well planners (e.g., geologists, drilling engineers and geophysicists) to improve information sharing, which increases the efficiency of planning drilling operations. In accordance with aspects of the present disclosure, a well planner uses a modeling and simulation application to simulate drilling a particular well in a model of a reservoir to determine technical parameters for drilling rigs (e.g., maximum torque, maximum drag, hydraulic pump capacity, rig maximum hook load, rig maximum rotational power, maximum water depth, max pump pressure, max drilling depth, and other rig capabilities). The technical parameters can be used to identify rigs available from a market. Additionally, in embodiments, the systems and methods use non-technical parameters (e.g., availability, price, region, distance, vendor, and contract terms) to identify the available rigs. By linking the above technical and non-technical parameters during well planning and linking these requirements rigs available from a market, implementations consistent with the present disclosure optimize well planning by improving the speed and accuracy of rig selection.

Further, in accordance with aspects of the present disclosure, a well planner identifies one or more rigs available during a time period using information provided by the market database. Using technical capabilities associated with the rigs as constraints, the modeling and simulation application can tailor a drilling plan for a well based on available rigs. In embodiments, the modeling and simulation application can simulate multiple solutions for the well and reject solutions that cannot be drilled based on the available rigs. Accordingly, available rigs can be acquired and allocated among one or more drilling operations that are within the respective capabilities of the rigs.

Figure 1:
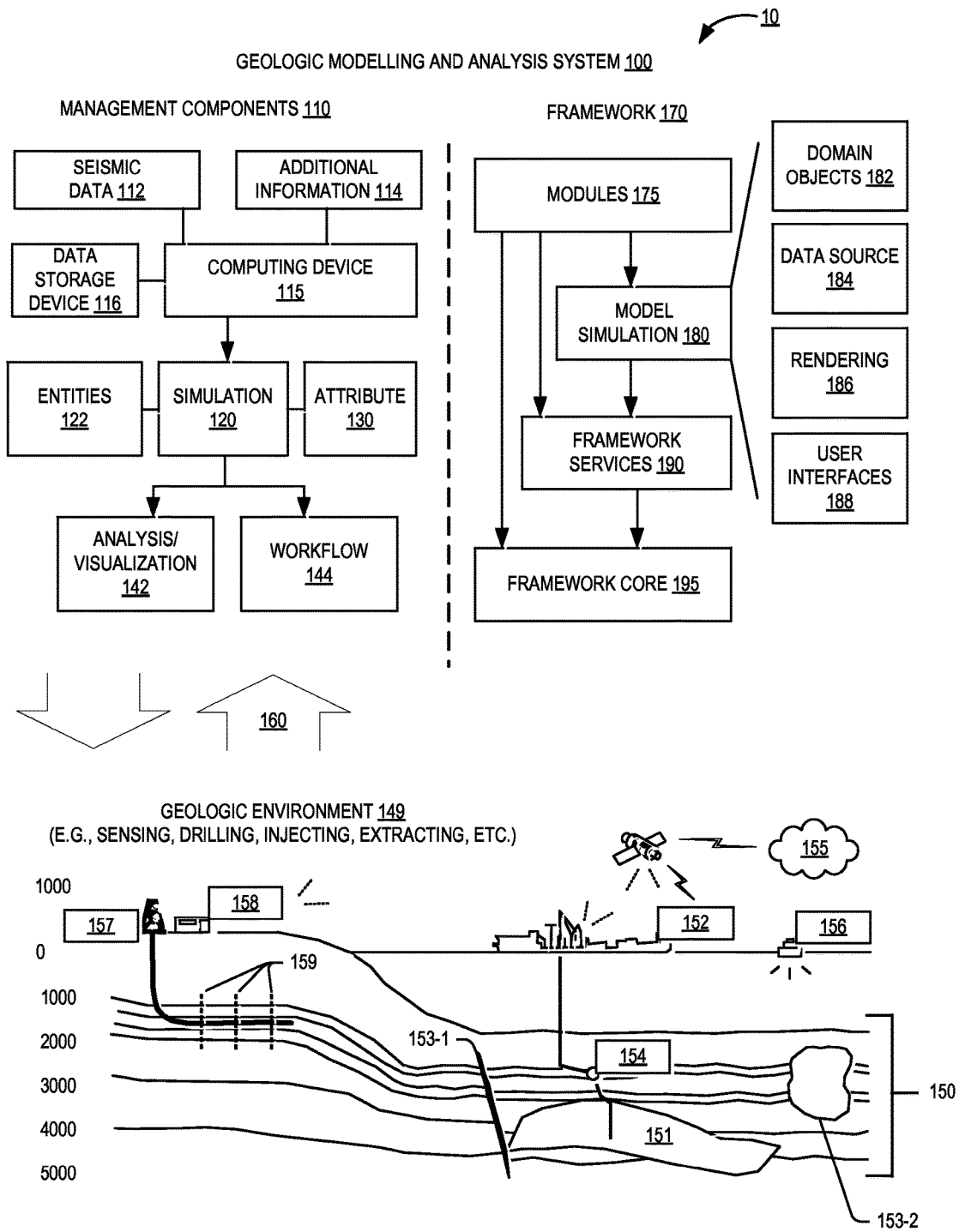
FIG. 1 illustrates a block diagram of an example of an environment for implementing methods and systems in accordance with aspects of the present disclosure.

FIG. 1 illustrates a block diagram of an environment 10 for implementing methods and systems in accordance with aspects of the present disclosure. The environment 10 includes a geologic modeling and analysis system 100 and a geologic environment 149. The management components 110 can allow for direct or indirect management of sensing, drilling, injecting, extracting, etc., with respect to the geologic environment 149. The geologic environment 149 can include, for example, a sedimentary basin 150, a reservoir 151, one or more faults 153-1, one or more geobodies 153-2, and the like. The geologic modeling and analysis system 100 can obtain information about the geologic environment 149 can be obtained as feedback 160, which can be input to one or more of the management components 110.

In accordance with aspects of the present disclosure, the geologic modeling and analysis system 100 includes hardware and software that perform the processes and functions described herein. In embodiments, the geologic modeling and analysis system 100 includes a computing device 115 and a hardware data storage device 116. In embodiments, the computing device 115 includes one or more processors, one or more memory devices (e.g., RAM and ROM), one or more I/O interfaces, and one or more network interfaces. The memory devices can include a local memory (e.g., a random access memory and a cache memory) employed during execution of program instructions. The data storage device 116 can comprise a computer-readable, non-volatile hardware storage device that stores information and program instructions. For example, the data storage device 116 can be one or more flash drives and/or hard disk drives.

Using the processor, the computing device 115 executes computer program instructions (e.g., an operating system and/or application programs), which can be stored in the memory devices and/or data storage device 116. Moreover, in accordance with aspects of the present disclosure, the computing device 115 can execute computer program instructions of the management component 110 and the framework 170.

In accordance with aspects of the present disclosure, the management components 110 include a seismic data component 112, an additional information component 114 (e.g., well/logging data), the computing device 115, the data storage device 116, a simulation component 120, an attribute component 130, an analysis/visualization component 142 and a workflow component 144. In operation, seismic data and information provided per the seismic data component 112 and the additional information component 114 may be input to the simulation component 120 to, for example, model the geologic environment 149.

In accordance with aspects of the present disclosure, the simulation component 120 is software, hardware, or a combination thereof that, when executed by the computing device 115, causes that geologic modeling and analysis system 100 to model and/or simulate drilling operations in the geologic environment 149. In embodiments, the simulation component 120 can use entities 122, which can include earth entities or geological objects such as wells, surfaces, bodies, reservoirs, etc. In the geologic modeling and analysis system 100, the entities 122 can include virtual representations of actual physical entities of, for example, the geologic environment 149 that are reconstructed for purposes of simulation by the simulation component 120. The entities 122 can be determined based on data acquired via sensing, observation, etc. (e.g., the seismic data 112 and other information 114), which can be obtained from the geologic environment 149 via feedback 160. Each of the entities 122 can be characterized by one or more properties. For example, a fracture entity can be characterized by one or more properties such as location, size, shape, volume, orientation, pressure, porosity, fluid density, pore volume, etc. The properties can represent one or more measurements (e.g., data acquired from the geologic environment and reference data), calculations (e.g., determined based on the acquired data and the reference data), etc.

In an example embodiment, such as shown in FIG. 1, the simulation component 120 can operate in conjunction with a software framework, such as an object-based framework. In the object-based framework, some or all of the entities can be have pre-defined classes and sub-classes that facilitate modeling and simulation. A commercially available example of an object-based framework is the MICROSOFT® .NET® framework (Redmond, Wash.), which provides a set of extensible object classes. In the .NET® framework, an object class encapsulates a module of reusable code and associated data structures. Object classes can be used to instantiate object instances for use in a program, script, etc. For example, borehole classes may define objects for representing boreholes based on well data.

In embodiments, such as the example of FIG. 1, the simulation component 120 can process information to conform to one or more attributes specified by the attribute component 130, which may include a library of attributes. Such processing may occur prior to input to the simulation component 120 (e.g., consider the computing device 115). As an example, the simulation component 120 may perform operations on input information based on one or more attributes specified by the attribute component 130. In an example embodiment, the simulation component 120 can construct one or more models of the geologic environment 149, which can be relied on to simulate behavior of the geologic environment 149 (e.g., responsive to one or more acts, whether natural or artificial, such as drilling a well).

In embodiments, such as the example of FIG. 1, the analysis/visualization component 142 allows for interaction with a model or model-based results (e.g., simulation results, etc.). For example, the output of the simulation may be presented using an interactive graphical user interface. Further, outputs from the simulation component 120 may be input to one or more other workflows, as indicated by a workflow component 144. For example, in accordance with aspects of the present disclosure, the simulation component 115 can exchange information with a rig selection module to query a commercial rig database, select available rigs, and model the operation of the rigs based on their respective technical capabilities.

In embodiments, the simulation component 120 can include one or more features of a simulator such as the ECLIPSE™ reservoir simulator (Schlumberger Limited, Houston Tex.), the INTERSECT™ reservoir simulator (Schlumberger Limited, Houston Tex.), a PETREL® drilling simulator (Schlumberger Limited, Houston Tex.), etc. As an example, a simulation component, a simulator, etc. can include features to implement one or more grid-less techniques (e.g., to solve one or more equations, etc.). As an example, a reservoir or reservoirs may be simulated with respect to one or more enhanced recovery techniques (e.g., consider a thermal process such as SAGD, etc.).

In embodiments, the management components 110 can include features of a commercially available framework such as the PETREL® seismic to simulation software framework (Schlumberger Limited, Houston, Tex.). The PETREL® framework provides components that allow for optimization of exploration, planning, and development operations. The PETREL® framework includes seismic to simulation software components that can output information for use in increasing reservoir performance, for example, by improving asset team productivity. Additionally, the PETREL® framework includes a drilling simulator that enables the display drilling of events in 2D or 3D, and correlates the events with geological properties of the reservoir.

Through use of such a framework, one or more analysts (e.g., geophysicists, geologists, and reservoir engineers) can develop collaborative workflows and integrate operations to streamline processes. Such a framework can be considered an application and can be considered a data-driven application (e.g., where data is input for purposes of modeling, simulating, etc.).

In embodiments, various aspects of the management components 110 may include add-ons or plug-ins that operate according to specifications of a framework environment. For example, a commercially available framework environment marketed as the OCEAN® framework environment (Schlumberger Limited, Houston, Tex.) allows for integration of add-ons (or plug-ins) into a PETREL® framework workflow. The OCEAN® framework environment leverages .NET® tools (Microsoft Corporation, Redmond, Wash.) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include the commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization.

In accordance with aspects of the present disclosure, the framework 170 includes features for implementing one or more grid generation techniques. In embodiments, the framework 170 can include an input component for receipt of information from interpretation of the seismic data, the attributes 130, as well as, for example, log data, image data, etc. Such a framework may include a grid generation component that processes input information, optionally in conjunction with other information, to generate a grid representing three-dimensional divisions of the geologic environment 149.

In embodiments, such as shown in the example of FIG. 1, the model simulation layer 180 may provide domain objects 182, act as a data source 184, provide for rendering 186, and provide for various user interfaces 188. Rendering 186 may provide a graphical environment in which applications can display their data while the user interfaces 188 may provide a common look and feel for application user interface components.

As an example, the domain objects 182 can include entity objects, property objects and optionally other objects. Entity objects may be used to geometrically represent wells, surfaces, bodies, reservoirs, fractures, etc., while property objects may be used to provide property values as well as data versions and display parameters. An entity object may represent a fracture in the reservoir where a property object provides log information as well as version information and display information (e.g., to display the well as part of a model).

In the example of FIG. 1, the sedimentary basin 150 may have layers (e.g., stratification) that include a reservoir 151 and one or more other features such as the fault 153-1, the geobody 153-2, etc. As an example, the geologic environment 149 may be outfitted with any of a variety of sensors, detectors, actuators, etc. in the sedimentary basin 150. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting, or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may additionally include circuitry for imagery (e.g., spatial, spectral, temporal, radiometric, etc.).

In embodiments, such as shown in FIG. 1, the geologic environment 149 can include equipment 157 and 158 associated with a well that includes a substantially horizontal portion that may intersect with the fractures 159. For example, the sedimentary basin 150 can be a shale formation and the fractures 159 can include natural fractures, artificial fractures (e.g., hydraulic fractures) or a combination of natural and artificial fractures in the shale formation. As an example, a well may be drilled for reservoir 151 that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of the fractures 159, etc.

In accordance with aspects of the present disclosure, the geologic modeling and analysis system 100 can be used to perform one or more workflows, such as workflow 144. Workflow 144 may be a process that includes a number of worksteps. A workstep may operate on data, for example, to create new data, to update existing data, etc. As an example, a workstep may operate on one or more inputs and create one or more results, for example, based on one or more algorithms. As an example, the management components 110 can include a workflow editor for creation, editing, executing, etc. of the workflow 144. In such an example, the workflow editor may provide for selection of one or more pre-defined worksteps, one or more customized worksteps, etc. As an example, the workflow 144 may be a workflow implementable in the PETREL® software, for example, that operates on seismic data, seismic attribute(s), etc. As an example, the workflow 144 may be a process implementable in the OCEAN® framework. As an example, the workflow 144 may include one or more worksteps that access a module such as a plug-in (e.g., external executable code, etc.). In accordance with aspects of the invention, the workflow implements a drilling simulation, which can be implemented in, the PETREL® software.

Figure 2:
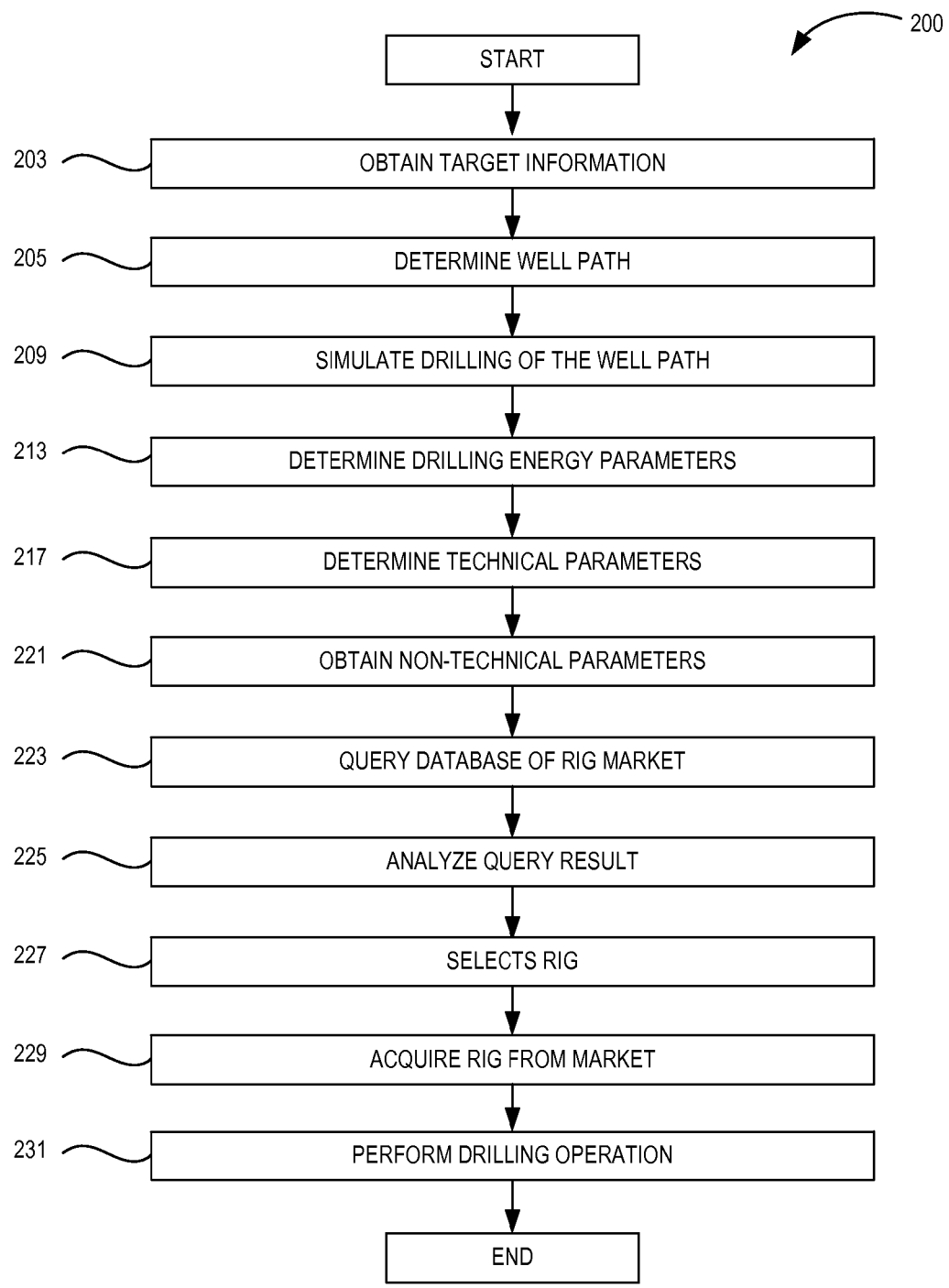
FIG. 2 illustrates a flow diagram of a process for identifying a drilling rig based on drilling requirements in accordance with aspects of the present disclosure.
Figure 3:
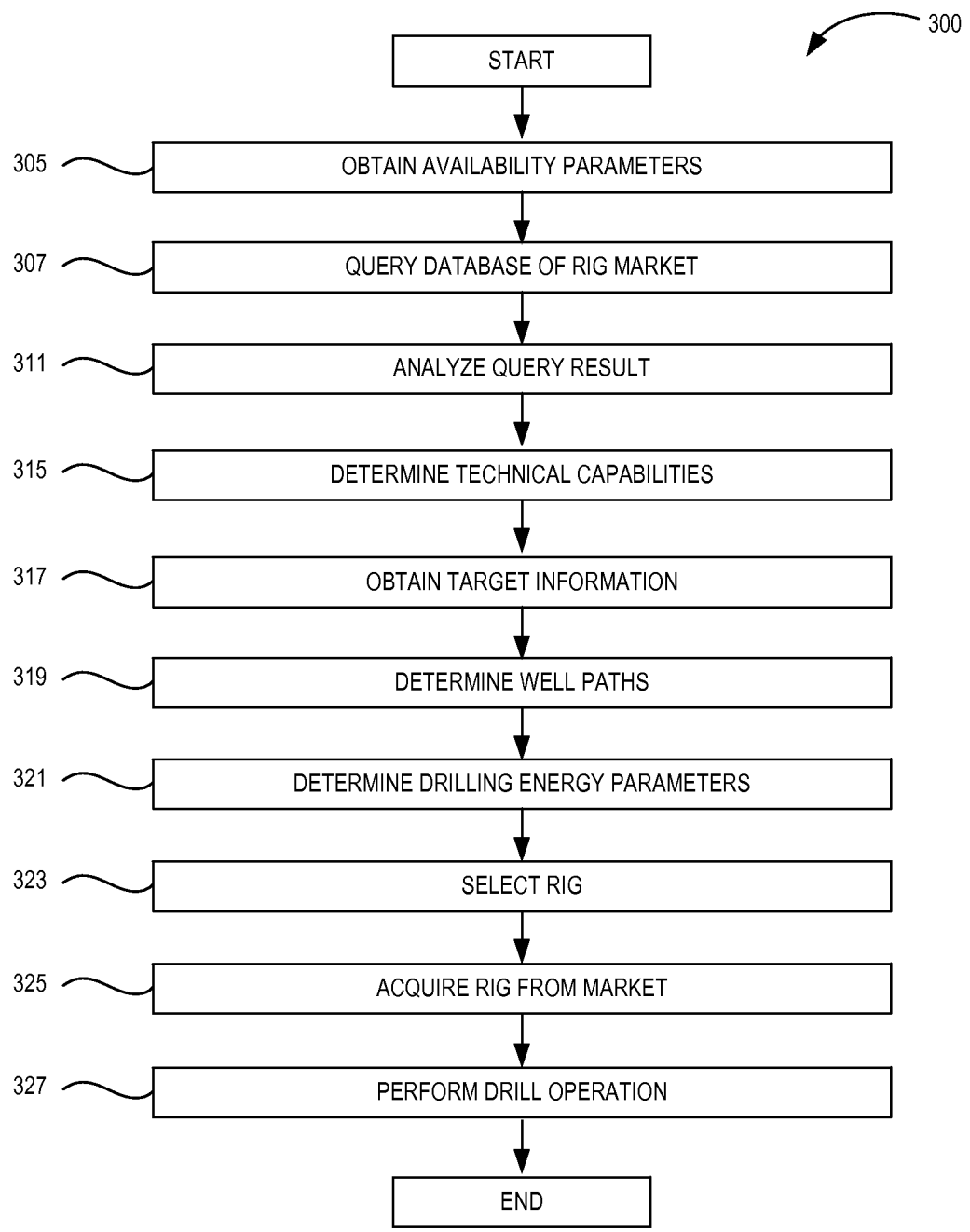
FIG. 3 illustrates a flow diagram of a process for determining drilling requirements based an identified drilling rig in accordance with aspects of the present disclosure.

The flowcharts in FIGS. 2 and 3 illustrate functionality and operations of possible implementations of systems, devices, methods, and computer program products according to various embodiments of the present disclosure. Each block in the flow diagrams of FIGS. 2 and 3 can represent a module, segment, or portion of program instructions, which includes one or more computer executable instructions for implementing the illustrated functions and operations. In some implementations, the functions and/or operations illustrated in a particular block of the flow diagram can occur out of the order shown in FIGS. 2 and 3. For example, two blocks shown in succession can be executed substantially concurrently, or the blocks can sometimes be executed in the reverse order, depending upon the functionality involved. It will also be noted that each block of the flow diagram and combinations of blocks in the block can be implemented by special purpose hardware-based systems that perform the specified functions or acts, or combinations of special purpose hardware and computer instructions.

FIG. 2 illustrates a flow diagram of an example of a process 200 for performing a drilling operation in accordance aspects of the present disclosure. The process 200 determines a plan for drilling a well to a reservoir, obtains parameters (e.g., requirements) associated with the plan, and selects a drilling rig from a database of available rigs based on the parameters. The process 200 can be implemented using the environment of FIG. 1 and using the system shown in FIG. 4.

At 203, the process 200 obtains target information for a drilling operation. In embodiments, the target information includes a location of a reservoir (e.g., reservoir 151) in an environment (e.g., geologic environment 149), as well as information describing the environment (e.g., seismic data 112 and additional information 114). For example, the reservoir information can be retrieved by a modeling and simulation application (e.g., simulation 120) from a data storage device (e.g., data storage device 116) and/or input by a user (e.g., a well planner) via a user interface of a computing device (e.g., computing device 115). The modeling and simulation application can determine a model (e.g., framework 175) that represents the environment, including the reservoir, based on models of entities (e.g., domain objects 182) in the environment.

At 205, the process 200 determines a well path to the reservoir based on the target information obtained at 203. In embodiments, a user (e.g., an analyst and/or a well planner) uses the modeling and simulation application to design the well path (based on, e.g., domain objects 182, rendering 186 and user interfaces 188). For example, using the modeling and simulation application, the user can design the well path which takes into account the entities and attributes included in a model of the environment (e.g., a 3D representation). In embodiments, the modeling and simulation application can assist the user in determining the path. For example, the modeling and simulation application can automatically generate an initial well path that may be optimized by the user.

At 209, the process 200 simulates drilling operations for the well path determined at 205. In embodiments, the modeling and simulation application executes a workflow (e.g., workflow 144) that simulates the drilling of the well along the well path based on the entities and attributes included in the model of the environment. The well path may take one of several different trajectories to reach the target and, as such, encounter and/or avoid different features and/or conditions of the environment.

At 213, the process 200 determines energy requirements for the drilling operations simulated at 209. The energy requirements represent the energy required by the drilling rig to run a hole to a target, pull out of hole the various equipment used to drill the well, and equip the well with hardware (bottom hole assembly, casing, completion, etc.) used in recovery. In embodiments, based on the paths determined by the simulation of the drilling operations, the different conditions and features that may be encountered can require more or less energy from a simulated rig, which impacts the capabilities that will be required for an actual rig. For example, different drilling trajectories may encounter regions having different densities, viscosities, hardness, depths, etc.

At 217, the process 200 determines technical parameters required for an actual drilling rig to complete the well path based on the path determined at 205 and/or the energy requirements determined at 213. The technical parameters can include, for example, maximum torque, maximum drag, maximum hydraulic pump capacity, maximum hook load, maximum rotational power, maximum water depth, maximum pump pressure, and maximum drilling depth. In embodiments, the modeling and simulation application outputs these technical parameters from the simulation of drilling the well.

At 221, the process 200 obtains non-technical parameters for the drilling operations simulated at 209. In embodiments, the user provides the non-technical parameters. The non-technical parameters can include availability requirements, which define times periods (specific times or timeframes) in which drilling operations will begin and end. Additionally, the non-technical parameters can include prices, regions, distances, vendors, and/or contract terms.

At 223, the process 200 submits a query to a database of a drilling rig market including at least some of the technical parameters. Additionally, in embodiments, the query to the database can also include the availability requirements. In accordance with aspects of the present disclosure, the database is a commercially available repository that aggregates information about various drilling rigs available from different vendors, such as the IHS Petrodata RigBase<sup>SM</sup>. The records corresponding to each of the rigs included in the database can be associated with respective sets of technical capabilities and non-technical constraints. In embodiments, the technical capabilities and non-technical constraints can correspond, respectively, to the technical parameters and non-technical parameters determined by the process 200. Thus, in accordance with aspects of the present disclosure, there is a direct correspondence between at least some of the individual technical parameters and non-technical parameters and individual technical capabilities and non-technical constraints included in the records of the rigs in the database. The process 200 can, therefore, make comparisons between the respective technical parameters and non-technical parameters, and the respective technical capabilities and non-technical constraints.

At 225, the process 200 analyzes a result of the query submitted at 223. In accordance with aspects of the invention, the query returns a set one or more rigs that meet the technical parameters and, in some embodiments, the availability requirements of the drilling operation. The process 200 compares the non-technical parameters with the non-technical constraints associated with the rigs identified in the query result. Based on the comparison, the process identifies rigs included in the set having non-technical constraints that satisfy the non-technical parameters (in addition to satisfying the technical parameters). For example, the process 200 can compare availability requirements with availability information associated with a rig identified in the query result. If it is determined that that the rig is unavailable during the time periods indicated by the availability requirements, the rig can be omitted from the set. Additionally, for example, the process 200 can compare a distance parameter of the non-technical parameters with distance information of a rig in the database. If the distance information of the rig exceeds the distance parameter, then that can be omitted from the set.

In accordance with aspects of the present disclosure, the process 200 outputs a list identifying rigs that meet the technical parameters and non-technical parameters. In embodiments, the process 200 can rank and/or order the rigs in the final list using ranking methods. For example, a rig that best matches with the technical parameters and non-technical parameters can be ranked highest and a rig that least matches the technical parameters and non-technical parameters can be ranked the lowest.

At 227, the process 200 selects one of the rigs identified at 225. In embodiments, the user selects one of the rigs from the list of rigs. For example, the process 200 can automatically select the highest ranked rig from the final. At 229, the process acquires the rig selected at 227. For example, based on the selection, the user can then launch a tendering process to acquire (e.g., lease) one of the identified rigs. At 231, the process performs the drilling operation simulated at 209 using the rig acquired at 229 based on the drill energy requirements determined at 213. Thus, the process 200 advantageously allows a drilling operation to identify and acquire a rig among the available rigs that is best-suited to the particular plan for a drilling operation.

FIG. 3 illustrates a flow diagram of an example of a process 300 for performing a drill operation in accordance aspects of the present disclosure. In an example consistent with the present disclosure, the process 300 determines a plan for the drill operation, determines requirements of the plan, and selects a drilling rig from a database of available rigs based on the requirements and the availability of the drilling rig within a predetermined time frame. The process 300 can be implemented using the environment of FIG. 1 and using the system shown in FIG. 4.

At 305, the process 300 obtains non-technical parameters for the drilling operation. The non-technical parameters can be the same as those previously discussed herein. In accordance with aspects of the present disclosure, the non-technical parameters include the availability requirements (e.g., a time frame in which a drill rig may be required according to the plan). At 307, the process 300 queries a database of a drilling rig market using at least some of the non-technical parameters obtained at 305. For example, a user may query the database based on the availability requirements as search terms. The database may the same or similar to that previously discussed herein.

At 311, the process 300 analyzes the result of the query from 307 based on the non-technical parameters obtained at 305. As discussed previously herein, each rig in the database can be represented by a record that is associated with technical capabilities and non-technical constraints. In accordance with aspects of the invention, the query result identifies one or more rigs in the database having non-technical constraints that satisfy at least some of the non-technical parameters included in the query. In embodiments, the analysis can be based solely on whether the availability of the rigs in the database satisfies availability requirements of the drilling operation. The analysis at 307 can produce a list of rigs available over a timeframe defined by the availability requirements.

At 315, the process 300 determines technical capabilities of the rigs identified in a response to the query 307. In embodiments, the technical capabilities are obtained from, for example, the records of the rigs in the database. At 317, the process 300 obtains target information in the same or similar manner to that previously discussed herein.

At 319, the process 300 determines various well paths based on the technical capabilities determined at 315 and the target information obtained at 317. In accordance with aspects of the present disclosure, the modeling and simulation application can determine the various well paths by simulating drilling operations in the model of the environment using the technical capabilities of the rigs as constraints. As such, the modeling and simulation application may determine different paths for the different rigs to avoid features of the environment that exceed the technical capabilities of each rig (e.g., maximum torque, maximum drag, hydraulic pump capacity, rig maximum hook load, rig maximum rotational power, maximum water depth, max pump pressure, max drilling depth.) Any of the rigs lacking the technical capability to reach the target can be eliminated from the list of available rigs identified at 311.

At 321, the process 300 determines drilling energy requirements for each of the well paths determined at 319 based on the target information in a same or similar manner to that previously discussed herein. The energy requirements can be the same as those previously discussed herein. At 323, the process 300 selects one of the rigs identified at 311 based on the drilling energy requirements determined at 321. For example, the process can select a rig having the lowest drilling energy requirement. At 325, the process 300 acquires the rig selected at 323. At 327, the process 300 performs the drilling operation of the well path determined at 315 simulated using the rig acquired at 325. Thus, the process 300 can determine a path for a well that best-suits the available rigs. While the process 300 above is discussed in terms of single drilling operation, it is understood that that the available rigs identified at by the query at 305 can be applied to several different well paths and/or drilling operations. Accordingly, available rigs can be acquired and assigned to a number drilling operations that are within the respective capabilities of the rigs.

Figure 4:
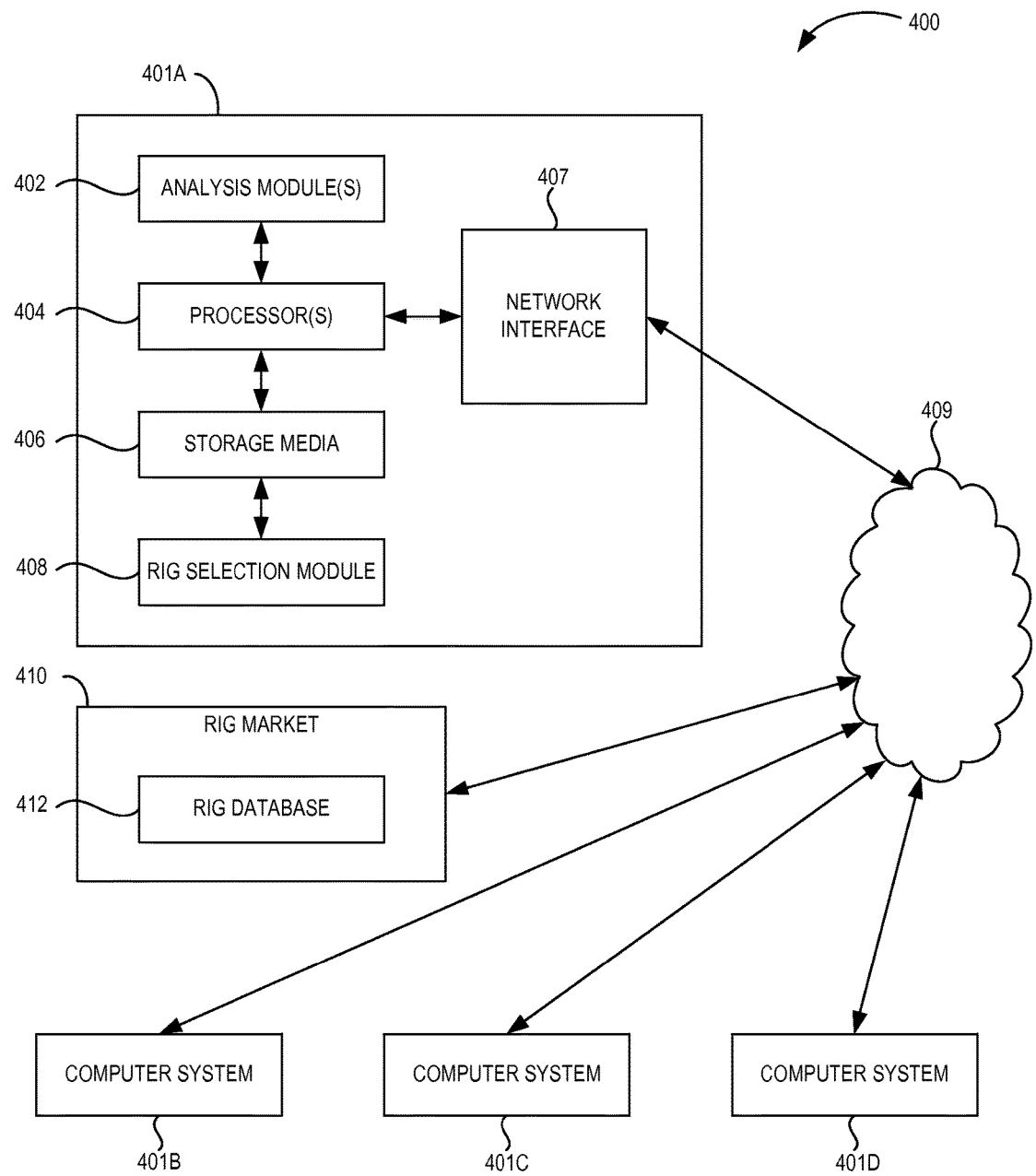
FIG. 4 illustrates a block diagram of a computing system in accordance with aspects of the present disclosure.

FIG. 4 illustrates a block diagram of a computing system 400 in accordance with aspects of the present disclosure. In some embodiments, the methods of the present disclosure (e.g., process 200 and process 300) may be executed by a computing system 400, which may be the same or similar to the system previously described herein (e.g., geologic modeling and analysis system 100). FIG. 4 illustrates an example of such a computing system 400, in accordance with some embodiments. The computing system 400 may include a computer or computer system 401A, which may be an individual computer system 401A or an arrangement of distributed computer systems. The computer system 401A can be the same or similar to that previously described herein (e.g., computing device 115). The computer system 401A includes one or more analysis modules 402 (modules 175, model simulation 180, etc.) that are configured to perform various tasks according to some embodiments, such as one or more methods disclosed herein (e.g., process 200 and process 300). To perform these various tasks, the analysis module 402 executes independently, or in coordination with, one or more processors 404, which is (or are) connected to one or more storage media 406. The processor(s) 404 is (or are) also connected to a network interface 407 to allow the computer system 401A to communicate over a data network 409 with one or more additional computer systems and/or computing systems, such as 401B, 401C, and/or 401D (note that computer systems 401B, 401C and/or 401D may or may not share the same architecture as computer system 401A, and may be located in different physical locations, e.g., computer systems 401A and 401B may be located in a processing facility, while in communication with one or more computer systems such as 401C and/or 401D that are located in one or more data centers, and/or located in varying countries on different continents).

A processor may include a microprocessor, microcontroller, processor module or subsystem, programmable integrated circuit, programmable gate array, or another control or computing device. The storage media 406 may be implemented as one or more computer-readable or machine-readable storage media. Note that while in the example embodiment of FIG. 4 storage media 406 is depicted as within computer system 401A, in some embodiments, storage media 406 may be distributed within and/or across multiple internal and/or external enclosures of computing system 401A and/or additional computing systems. Storage media 406 may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLU-ERAY® disks, or other types of optical storage, or other types of storage devices. Note that the instructions discussed above may be provided on one computer-readable or machine-readable storage medium, or alternatively, may be provided on multiple computer-readable or machine-readable storage media distributed in a large system having possibly plural nodes. Such computer-readable or machine-readable storage medium or media is (are) considered to be part of an article (or article of manufacture). An article or article of manufacture may refer to any manufactured single component or multiple components. The storage medium or media may be located either in the machine running the machine-readable instructions, or located at a remote site from which machine-readable instructions may be downloaded over a network for execution.

In some embodiments, computing system 400 contains one or more rig selection modules 408. In the example of computing system 400, computer system 401A includes the rig selection modules 408. In some embodiments, a single rig selection module 408 may be used to perform at least some aspects of one or more embodiments of the methods disclosed herein. In alternate embodiments, a plurality of rig selection modules 408 may be used to perform at least aspects of methods herein.

In accordance with aspects of the invention the system 400 includes a drilling rig market 410, which maintains a rig database 412. The rig selection module 408 can communicate with the rig database 412 via the network interface and the data network 409 to query the database 412 for rig information (e.g., technical capabilities and non-technical constraints).

It should be appreciated that computing system 400 is one example of a computing system, and that computing system 400 may have more or fewer components than shown, may combine additional components not depicted in the example embodiment of FIG. 4, and/or computing system 400 may have a different configuration or arrangement of the components depicted in FIG. 4. The various components shown in FIG. 4 may be implemented in hardware, software, or a combination of hardware and software, including one or more signal processing and/or application specific integrated circuits.

Further, the processing method described herein may be implemented by running one or more functional modules in information processing apparatus such as general purpose processors or application specific chips, such as ASICs, FPGAs, PLDs, or other appropriate devices. These modules, combinations of these modules, and/or their combination with general hardware are included within the scope of protection of the present disclosure.

Geologic interpretations, models, and/or other interpretation aids may be refined in an iterative fashion; this concept is applicable to the methods discussed herein. This may include use of feedback loops executed on an algorithmic basis, such as at a computing device (e.g., computing system 100, FIG. 4), and/or through manual control by a user who may make determinations regarding whether a given step, action, template, model, or set of curves has become sufficiently accurate for the evaluation of the subsurface three-dimensional geologic formation under consideration.

The flow diagram in FIG. 4 illustrates functionality and operation of possible implementations of systems, devices, methods, and computer program products according to various embodiments of the present disclosure. Each block in the flow diagrams of FIG. 4 can represent a module, segment, or portion of program instructions, which includes one or more computer executable instructions for implementing the illustrated functions and operations. In some alternative implementations, the functions and/or operations illustrated in a particular block of the flow diagrams can occur out of the order shown in FIG. 4. For example, two blocks shown in succession can be executed substantially concurrently, or the blocks can sometimes be executed in the reverse order, depending upon the functionality involved. It will also be noted that each block of the flow diagrams and combinations of blocks in the block can be implemented by special purpose hardware-based systems that perform the specified functions or acts, or combinations of special purpose hardware and computer instructions.

The foregoing description, for purpose of explanation, has been described with reference to specific embodiments. However, the illustrative discussions above are not intended to be exhaustive or to limit the present disclosure to the precise forms disclosed. Many modifications and variations are possible in view of the above teachings. Moreover, the order in which the elements of the methods described herein are illustrated and described may be re-arranged, and/or two or more elements may occur simultaneously. The embodiments were chosen and described in order to best explain the principals of the present disclosure and its practical applications, to thereby enable others skilled in the art to best utilize the present disclosure and various embodiments with various modifications as are suited to the particular use contemplated. Additional information supporting the disclosure is contained in the appendix attached hereto.

It will also be understood that, although the terms first, second, etc. may be used herein to describe various elements, these elements should not be limited by these terms. These terms are used to distinguish one element from another. For example, a first object or step could be termed a second object or step, and, similarly, a second object or step could be termed a first object or step, without departing from the scope of the present disclosure. The first object or step, and the second object or step, are both, objects or steps, respectively, but they are not to be considered the same object or step.

The terminology used in the present disclosure is for the purpose of describing particular embodiments and is not intended to be limiting of the present disclosure. As used in the present disclosure and the appended claims, the singular forms "a," "an" and "the" are intended to include the plural forms as well, unless the context clearly indicates otherwise. It will also be understood that the term "and/or" as used herein refers to and encompasses any possible combinations of one or more of the associated listed items. It will be further understood that the terms "includes," "including," "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Further, as used herein, the term "if" may be construed to mean "when" or "upon" or "in response to determining" or "in response to detecting," depending on the context.

What is claimed is:

1. A method comprising:
   querying a database of a drilling rig market using one or more non-technical parameters of a drilling operation;
   determining technical capabilities of one or more drilling rigs in the database identified in response to the querying of the database;
   determining a plurality of well paths for the drilling operation based on the technical capabilities of the one or more drilling rigs in the database;
   analyzing a result of the querying by comparing a plurality of technical parameters with the technical capabilities of the one or more drilling rigs in the database, wherein the technical parameters are required to complete the plurality of well paths;
   selecting a drilling rig from the one or more drilling rigs in the database for acquisition from the drilling rig market based on the plurality of well paths and the technical capabilities of the one or more drilling rigs;
   acquiring the selected drilling rig from the drilling rig market; and
   performing the drilling operation of a well path of the plurality of well paths using the selected drilling rig.

2. The method of claim 1, wherein the one or more non-technical parameters comprise an availability requirement that defines time periods in which the drilling operation will begin and end.

3. The method of claim 2, further comprising obtaining target information for the drilling operation, the target information including a location of a reservoir in an environment and seismic data describing one or more features of the environment, wherein the plurality of well paths are determined based on the technical capabilities and the target information.

4. The method of claim 3, wherein determining the plurality of well paths comprises simulating drilling the plurality of well paths using a model of the environment and the technical capabilities of the one or more drilling rigs to avoid features of the environment that exceed the technical capabilities of the one or more drilling rigs.

5. The method of claim 4, wherein simulating comprises determining drilling energy requirements corresponding to the plurality of well paths, and wherein the drilling rig is also selected based on the drilling energy requirements.

6. A computing system, comprising:
   one or more processors; and
   a memory system comprising one or more non-transitory' computer-readable media storing instructions that, when executed by at least one of the one or more processors, cause the computing system to perform operations, the operations comprising:
   querying a database of a drilling rig market based on one or more non-technical parameters of a drilling operation;
   determining technical capabilities of one or more drilling rigs in the database identified in response to the querying of the database;
   determining a plurality of well paths based on the technical capabilities of the one or more drilling rigs in the database;
   analyzing a result of the querying by comparing a plurality of technical parameters with the technical capabilities of the one or more drilling rigs in the database, wherein the technical parameters are required to complete the plurality of well paths;
   selecting a drilling rig from the one or more drilling rigs for acquisition from the drilling rig market based on the plurality of well paths and the technical capabilities of the one or more drilling rigs;
   acquiring the selected drilling rig from the drilling rig market; and
   performing the drilling operation of a well path of the plurality of well paths using the selected drilling rig.

7. The system of claim 6, wherein the one or more non-technical parameters comprises an availability requirement that defines time periods in which the drilling operation will begin and end.

8. The system of claim 7, further comprising obtaining target information for the drilling operation, the target information including a location of a reservoir in an environment and information describing one or more features of the environment.

9. The system of claim 8, wherein determining the plurality of well paths comprises simulating drilling the plurality of well paths using a model of the environment and the technical capabilities of the one or more drilling rigs.

10. The system of claim 9, wherein simulating comprises determining drilling energy requirements corresponding to the plurality of well paths.

11. A computer program product comprising non-transitory computer-readable device storing program instructions that, when executed by at least one processor of a computing system, cause the computing system to perform operations, the operations comprising:
 determining a well path of a drilling operation based on target information of an environment;
 simulating drilling of the well path using a model of the environment;
 determining a plurality of technical parameters required for a drilling rig to complete the well path based on the simulating;
 obtaining one or more non-technical parameters of the drilling operation; and
 selecting the drilling rig from a database of a drilling rig market based on the plurality of technical parameters and the one or more non-technical parameters, wherein the selecting comprises:
  querying the database of the drilling rig market; and
  analyzing a result of the querying by comparing the plurality of technical parameters with technical capabilities of the drilling rig in the database;
  acquiring the selected drilling rig from the drilling rig market; and
  performing the drilling operation of the well path using the selected drilling rig.

12. The computer program product of claim 11, wherein the operations comprise obtaining the target information, the target information including a location of a reservoir in the environment and information describing the features of the environment.

13. The computer program product of claim 11, wherein the one or more non-technical parameters comprise an availability requirement that defines time periods in which a drilling operation will begin and end.

14. The computer program product of claim 11, wherein determining a plurality of technical parameters comprises determining drilling energy requirements corresponding to drilling the well path.

15. The computer program product of claim 14, wherein the plurality of technical parameters comprise a plurality of the following: maximum torque, maximum drag, maximum hydraulic pump capacity, maximum hook load, maximum rotational power, maximum water depth, maximum pump pressure, and maximum drilling depth.

16. The computer program product of claim 11, wherein analyzing comprises comparing the non-technical parameters with non-technical constraints of the drilling rig included in the drilling rig database.

* * * * *